United States Patent [19]
Hagiya et al.

[11] Patent Number: 5,473,198
[45] Date of Patent: Dec. 5, 1995

[54] SEMICONDUCTOR MEMORY DEVICE BONDING PAD ARRANGEMENT

[75] Inventors: Kouki Hagiya; Ken Shibata, both of Tachikawa, Japan

[73] Assignees: Hitachi, Ltd., Tokyo; Hitachi Device Engineering Co., Ltd., Chiba, both of Japan

[21] Appl. No.: 258,546

[22] Filed: Jun. 10, 1994

[30] Foreign Application Priority Data

Jun. 11, 1993 [JP] Japan ................................. 5-166461

[51] Int. Cl.⁶ ................................................ H01L 23/48
[52] U.S. Cl. .................... 257/786; 257/676; 257/686
[58] Field of Search ................................. 257/786, 686, 257/676

[56] References Cited

U.S. PATENT DOCUMENTS 5,068,712  11/1991  Murakami et al. ................... 257/689
5,165,067  11/1992  Wakefield et al. ................... 257/786
5,365,113  11/1994  Sakuta et al. ....................... 257/786

FOREIGN PATENT DOCUMENTS 3-214669  9/1991  Japan .

Primary Examiner—Robert P. Limanek
Attorney, Agent, or Firm—Antonelli, Terry, Stout & Kraus

[57] ABSTRACT

A semiconductor memory device having inner lead portions of a plurality of leads disposed through at least one insulating film on a semiconductor chip and electrically insulated from the semiconductor chip, includes bonding pads for at least data input/output arranged in two rows axially symmetrically in a substantially central portion of the semiconductor chip interposed between memory arrays and bonding wires for connecting the inner lead portions and the bonding pads.

17 Claims, 12 Drawing Sheets

SEMICONDUCTOR MEMORY DEVICE BONDING PAD ARRANGEMENT

BACKGROUND OF THE INVENTION

1. Field of the Invention

The present invention relates to a semiconductor memory device, and more particularly to a semiconductor memory device suitable for a memory such as a dynamic RAM (Random Access Memory) formed into the LOC (Lead-On-Chip) structure and having a multiple-bit configuration.

2. Description of the Related Art

There is known a dynamic RAM adopting a package structure called the Lead-On-Chip (LOC) in which a semiconductor chip is packed in a package together with leads. The dynamic RAM having such a LOC structure is disclosed in, for example, JP-A-3-214669 and U.S. Pat. No. 5,068,712.

In the LOC structure, a lead pattern is affixed on a surface of a semiconductor chip through an insulating layer. In this structure, heretofore generally, bonding pads are arranged in a center of the chip in a line in the longitudinal direction of the chip as shown in JP-A-3-214669.

Further, in U.S. Pat. No. 5,068,712, bonding pads, that is, bonding pads for address data are arranged in two rows in a center of a chip.

SUMMARY OF THE INVENTION

Generally, the number of bonding pads in a semiconductor memory device is increased and a chip size thereof is reduced due to the request of high integration.

For example, in a so-called synchronous dynamic RAM, in order to cope with noise occurring due to high-speed reading and writing operation (that is, in order to prevent the malfunction due to noise), terminals for power supplies VCC and VSS are provided for each of a predetermined number of input/output circuits. Accordingly, it is necessary to provide a number of pads for power supply except pads for the input/output circuits. In addition, since an output MOS transistor drives a relatively large load at a high speed, it is necessary to flow a relatively large drive current, and since it is necessary to increase a size of the chip in accordance with the large drive current, a space between pads for the output circuit is increased. Accordingly, there is a problem that a length of the row of pads becomes longer and the request for miniaturization of the chip size is not solved.

In addition, when RAM's are mounted on both sides of a mounting substrate (in case of the both-side mounting), there is a method that a mask for RAM chips on the reverse side of the substrate is corrected to reconstruct the RAM chip differently from the RAM's on the obverse side.

On the other hand, as a simplest method, as shown in FIG. 1, outer lead portions 16 of a lead frame for a RAM on the reverse side may be bent in opposite direction to those of the RAM on the obverse side. In the LOC structure as shown in FIG. 1, however, a thickness of a resin molding 12 on the side of a chip is different from that on the side of leads and accordingly when the outer lead portions of the RAM on the reverse side are bent in the opposite direction to those of the RAM on the obverse side, stress applied to the resin and a chip 10 of the RAM on the obverse side is different from that of the RAM on the reverse side. Consequently, there is a problem in the durability in that crack occurs in a base of the outer lead portion of the RAM on the reverse side during the long-term use and the lead is liable to be broken.

It is an object of the present invention to provide a semiconductor memory device capable of attaining reduction in chip size irrespective of increased length of a row of pads and increased number of pads.

It is another object of the present invention to provide a semiconductor memory device capable of mounting chips on both sides without deterioration of durability and modification and addition of a manufacturing process while attaining high integration.

According to an aspect of the present invention, there is provided a semiconductor memory device including inner lead portions of a plurality of leads disposed through at least one insulating film on a semiconductor chip and being electrically insulated from the semiconductor chip, comprising bonding pads for at least data input/output arranged in two rows axially symmetrically in a substantially central portion of the semiconductor chip interposed between memory arrays and bonding wires for connecting the inner lead portions and the bonding pads.

With such a structure, since the row of pads can be made short, a size of the chip can be made small correspondingly, and a RAM mounted on a reverse side can be obtained by the same wire bonding process as that of a RAM mounted on an obverse side.

According to an example of the present invention, a space between one row and the other row of the bonding pads arranged in two rows has a distance sufficient to connect the bonding wires by means of the nail head bonding.

According to an example of the present invention, at least one input/output buffer is further disposed between one row and the other row of the bonding pads arranged in two rows.

By disposing the input/output buffer between the bonding pads arranged in two rows as described above, a space formed by the two-row arrangement of the pads can be utilized effectively.

According to an example of the present invention, a smoothing condenser for holding a boosted voltage for driving output MOSFET's is further disposed between one row and the other row of the bonding pads arranged in two rows.

In this manner, by disposing the smoothing condenser, a space formed by the two-row arrangement of the pads can be utilized effectively.

According to an example of the present invention, bonding pads for address data are arranged in two rows in substantially the same straight line as those of the bonding pads arranged in two rows.

Thus, a length of the chip in the direction along the row of the bonding pads can be shortened.

According to an example of the present invention, each of the bonding pads in one row of the arranged-in-two-row bonding pads is arranged between associated two adjacent bonding pads of the other row.

Thus, a width between the rows of the bonding pads arranged in two rows can be shortened.

According to another aspect of the present invention, there is provided a semiconductor memory system which includes a substrate and two semiconductor memory devices according to the one aspect, mounted on one side and the other side of the substrate, respectively, so that a principal surface of the semiconductor memory devices is opposed to a surface opposite to the principal surface through the substrate.

More particularly, even if the bonding pads arranged in two rows in the semiconductor memory device on the obverse side are reversed to those in the semiconductor memory device on the reverse side by mounting the semiconductor memory devices on both the sides as described above, there is no problem in operation of the memory since the bonding pads arranged in two rows are used for input/output of data. Accordingly, the outer lead portions of the semiconductor memory device on the obverse side are bent in the same direction as the outer lead portions of the semiconductor memory device on the reverse side and there is no problem in the durability of leads. It is not necessary to correct a RAM chip mask depending on the semiconductor memory devices on the obverse side and the reverse side. Further, bonding pads for inputting address data can be also arranged in two rows.

According to still another aspect of the present invention, there is provided a semiconductor memory device system which includes a semiconductor array including a plurality of semiconductor memory devices having the above structure, a central processing unit for controlling reading/writing of data for the semiconductor array, and an interface circuit for interfacing the central processing unit and the semiconductor array.

Figure 13:
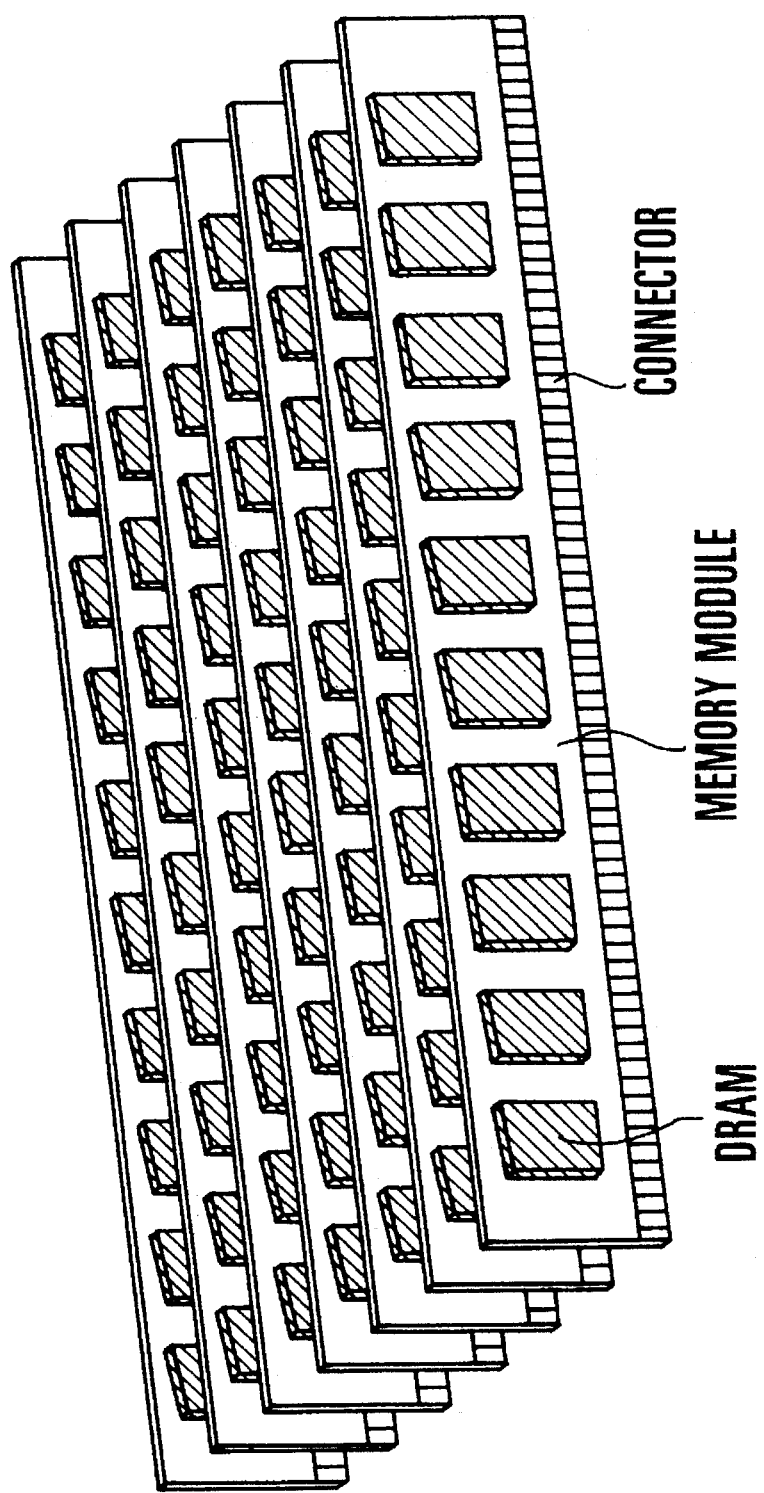
Figure 14:
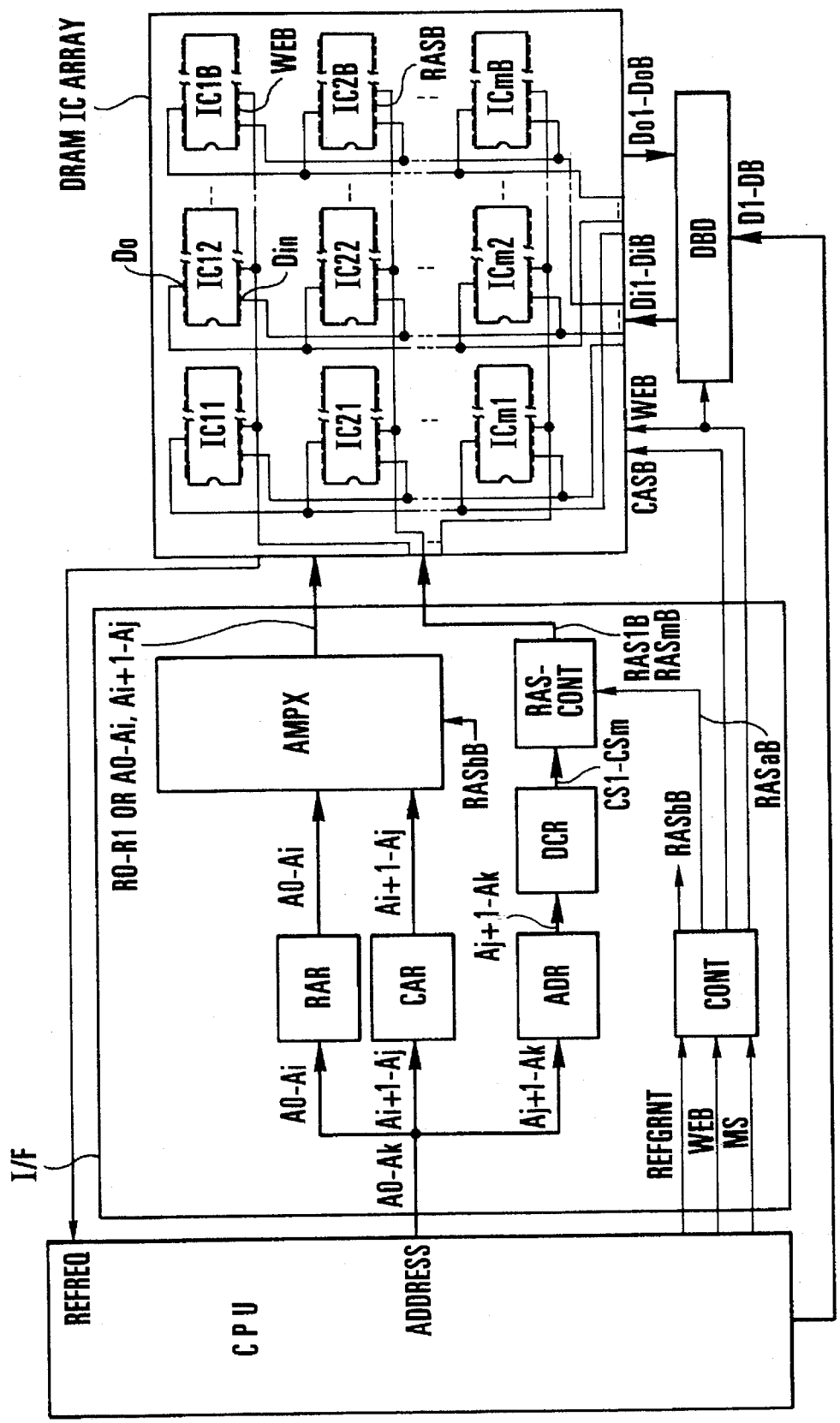

FIG., 12 is a schematic diagram illustrating a portion of an embodiment of a dynamic RAM (DRAM) to which the present invention is applied;

FIG. 13 is a perspective view illustrating a memory storage unit in a computer system using semiconductor memory devices according to the present invention; and FIG. 14 is a block diagram schematically illustrating a DRAM control system using semiconductor memory devices according to the present invention.

DESCRIPTION OF THE PREFERRED EMBODIMENTS

Embodiments of a semiconductor memory device according to the present invention are now described in detail with reference to the accompanying drawings. The following embodiments of the present invention are applied to a DRAM.

Figure 1:
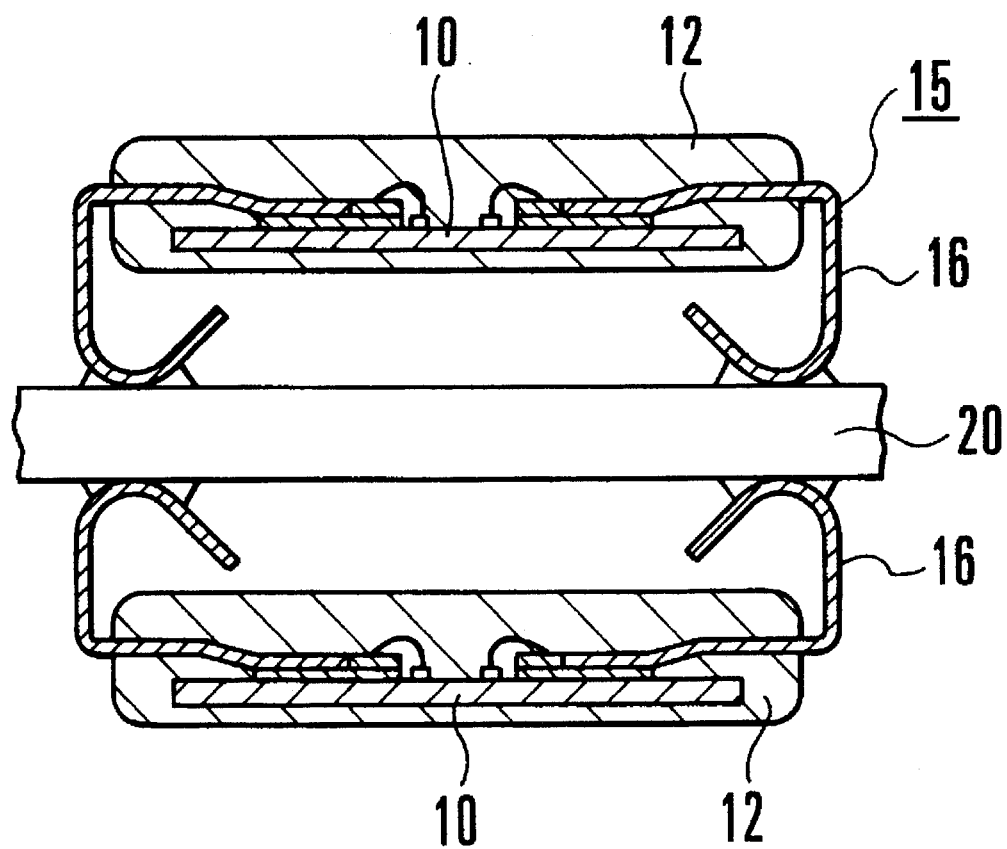
FIG. 1 is a schematic side view in section illustrating semiconductor memory devices having a conventional LOC structure and mounted on both sides.
Figure 2:
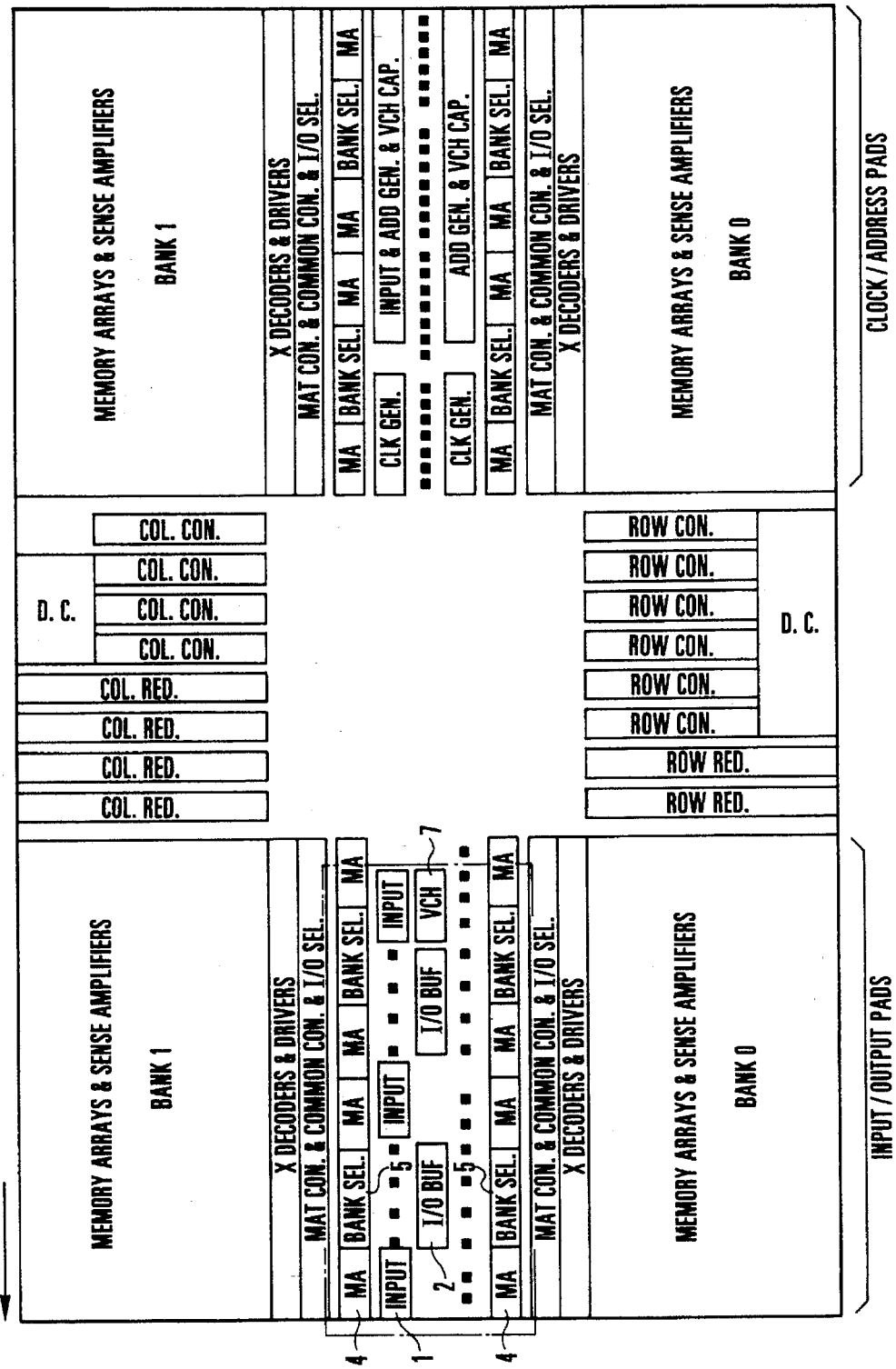
FIG. 2 is a schematic circuit diagram in block form illustrating a memory mat portion and a peripheral circuit portion of an embodiment of a semiconductor memory device according to the present invention.

FIG. 2 schematically illustrates a circuit block diagram of a memory mat portion and a peripheral circuit portion of an embodiment of a semiconductor memory device according to the present invention. Circuit blocks of FIG. 2 are fabricated on a single semiconductor substrate of monocrystalline silicon by a known fabrication technique of a semiconductor integrated circuit. The circuit blocks of FIG. 2 are described to substantially conform to an actual geometric arrangement on the semiconductor substrate.

In the embodiment, in order to prevent reduction of the operational speed due to long length of various wirings for control signals and memory array drive signals caused by a large chip size due to a large capacity of a memory, a memory array portion constituting a RAM and a peripheral circuit portion for selecting an address are arranged as follows.

In FIG. 2, a cross-shaped area formed by a longitudinal central portion and a traverse central portion of a chip is provided. A peripheral circuit is mainly disposed in the cross-shaped area and the chip is divided into two portions by the longitudinal central portion of the cross-shaped area to provide banks 0 and 1. The banks 0 and 1 are divided into two portions by the traverse central portion, respectively. Thus, the cross-shaped area is provided in the central portions in the longitudinal direction and the traverse direction of the chip and memory arrays and sense amplifiers are formed in the banks. Each of four memory arrays has, for example, about 4 M bits as described later, although not limited. Accordingly, the four memory arrays have a large memory capacity of about 16 M bits as a whole.

In one memory array, two memory mats are disposed on each side of a sense amplifier train to provide four memory blocks, although not shown. Thus, the sense amplifier train is utilized by a pair of memory mat groups disposed both sides of the sense amplifier train in common to constitute a so-called shared sense amplifier system. The memory mat includes word lines arranged to extend in the traverse direction and a pair of complementary bit lines (data lines or digit lines) perpendicular to the word lines and disposed to extend in the longitudinal direction in parallel.

X decoders and drivers for selecting the word lines are disposed in the memory arrays near the central portion. Disposed in the X decoder and driver are a mat control circuit (MAT Con.), a common input/output line control circuit (Common Con.) and an input/output line selection circuit (I/O Sel.). Main amplifiers (MA) are provided on the side of the central portion of the chip near the mat control circuit, the common input/output line control circuit and the input/output line selection circuit in corresponding manner to the memory blocks formed by dividing the memory arrays into four portions. A memory bank selection circuit (Bank Sel.) is disposed between the main amplifiers. The above circuits are disposed symmetrically to a central line in the longitudinal direction of the semiconductor chip.

A column system control circuit (Col. Con.) and a column system redundancy circuit (Col. Red.) are provided in the right area of the central portion in the traverse direction of the semiconductor chip. The column system redundancy circuit includes a failure address memory unit and a failure address detection circuit and replaces a failed Y selection circuit by a preliminary Y selection circuit. DC represents a power supply circuit for producing an internal operation voltage.

A row system control circuit (Row. Con.) and a row system redundancy circuit (Row. Red.) are provided in the left area of the central portion in the traverse direction of the semiconductor chip. The row system redundancy circuit includes a failure address memory unit and a failure address detection circuit and replaces a failed word line by a preliminary word line. DC represents a power supply circuit for producing an internal operation voltage.

The row system control circuit includes a test circuit for monitoring an input order of a row address strobe signal RASB, a column address strobe signal CASB and a write enable signal WEB and identifying a test mode to perform a test operation different from the normal operation, although not limited.

Various bonding pads are disposed in the central area in the longitudinal direction of the chip. As an example of the bonding pads, there is an external power supply pad. The number of pads for supplying a ground potential of a circuit in order to increase a level margin of an input, that is, in order to reduce an impedance of a power supply is relatively as large as more than ten in total and the pads are arranged side by side in a substantially straight line. The ground potential pads are connected to a ground potential leads formed by the so-called LOC technique and extending in the longitudinal direction. Pads provided for prevention of rising due to coupling of a non-selected word line of the word driver and clearing of the word line and pads provided for a common source of the sense amplifier, of the ground potential pads are mainly provided to reduce the power impedance.

Bonding pads indicated by black square are arranged in two rows side by side axially symmetrically, (that is, symmetrically with respect to a substantially central line in the longitudinal direction of the chip) in a substantially central portion of the upper half in FIG. 2 of the chip, although not limited. An input/output buffer (I/O Buf.) 2, a boosted voltage circuit (VCH) 7 described later and an output capacitor (CAP) 6 thereof are disposed between the bonding pad rows. An input first stage circuit (Input) 1 and an output circuit 3 (output MOSFET's) for the input/output buffer 2 described later are formed in spaces between the pads of the right-hand bonding pad row. Accordingly, power terminals and data terminals for performing reading/writing in a unit of a plurality of bits such as 8 bits are allotted to the bonding pads arranged in two rows.

Bonding pads indicated by black square are arranged in a row in the longitudinal direction in the substantially central portion of the lower half of the chip. A clock generating circuit (CKL. Gen.), an input first stage circuit (Input), an address signal generating circuit (Add. Gen.), a boosted voltage producing circuit (VCH), and a capacitor (Cap) are disposed on both sides of the bonding pad row.

Figure 3:
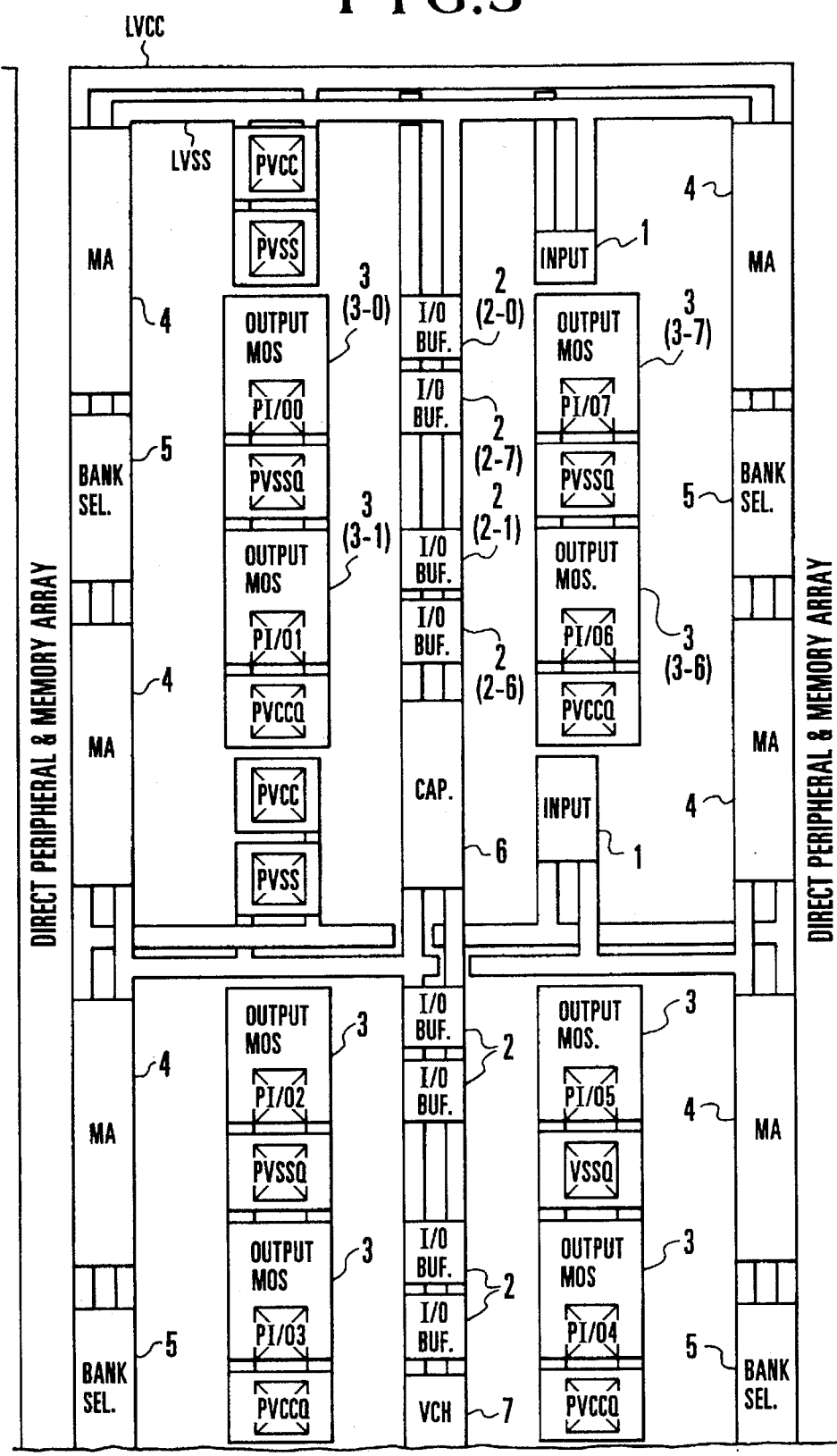
FIG. 3 is an enlarged view of a part of the peripheral circuit portion of FIG. 2.

FIG. 3 is an enlarged view of the central portion of the upper half (portion surrounded by one-dot chain line) of FIG. 2. In FIG. 3, the above circuits, the bonding pads and lines LVCC and LVSS for power supplies VCC and VSS are also described.

In FIG. 3, numeral 1 denotes an input first stage and input buffer circuit which is used for input of data. Numeral 2 denotes an input/output buffer (in this example, input buffer), 3 an output circuit (for example, a pair of MOSFET's) driven by the output buffer, 4 a main amplifier (MA), 5 a Y decoder selection circuit (bank selection circuit), 6 a smoothing circuit for a booster circuit, and 7 a boosted voltage producing circuit. In FIG. 3, bonding pads are represented by square mark with X therein.

In the embodiment, a row of pads PI/O0, PI/O1, PI/O2 and PI/O3 for data I/O0 to I/O3 and pads PVSSQ and PVCCQ for power terminals of the output circuit and a row of pads PI/O7, PI/O6, PI/O5 and PI/O4 for data I/O7 to I/O4 and pads PVSSQ and PVCCQ for power terminals, of the bonding pads arranged in two rows are arranged symmetrically with respect to the central line in the longitudinal direction in FIG. 3, that is, a row of the input buffers 2, condenser 6 and VCH 7.

The power supplies VCCQ and VSSQ for the output circuits are to supply the power supply voltage VCC and a circuit potential VSS to a plurality of, for example two, output circuits 3 independently and serve to prevent influence of noise generated in the power line upon operation of the output circuit to other circuits. Accordingly, power lines for supplying the power supply voltage VCC and the ground voltage VSS to the two output buffers 3 from the pair of pads PVCCQ and PVSSQ are extended to the output buffer. On the contrary, other circuits are supplied with power supply voltages in common by means of power lines LVCC and LVSS.

Figure 4:
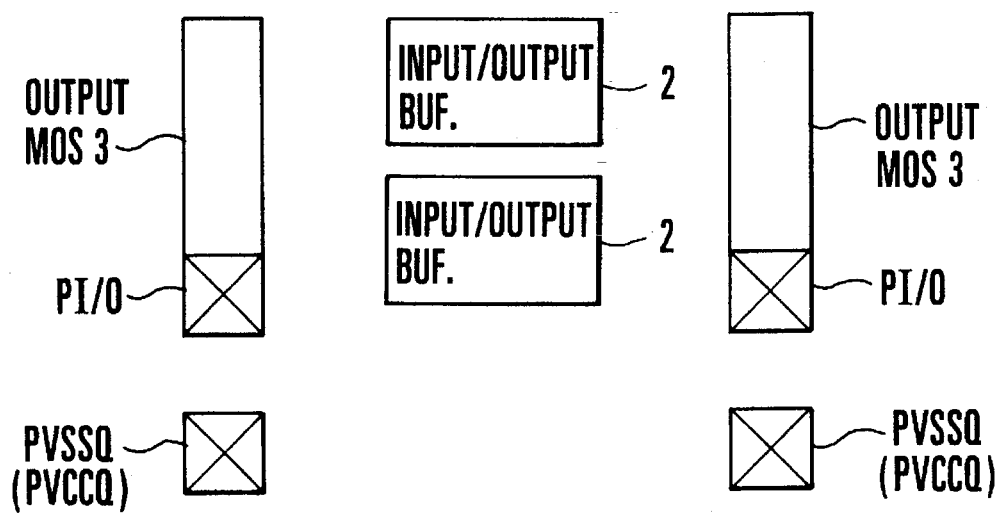
FIG. 4 is a diagram illustrating a positional relation of data input/output pads, output MOSFET's and input buffers in the peripheral circuit portion of FIG. 2.

FIG. 4 is an enlarged view illustrating a positional relation of the data input/output pads PI/O, the output MOSFET's and the input/output buffers. As a space between pads in the same row, it is necessary to provide a fixed space substantially corresponding to a pitch of leads. This space is utilized to form the output MOSFET's 3. In order that the output MOSFET drives a relatively large load at a high speed, it is necessary to flow a relatively large drive current in the output MOSFET and to form the output MOSFET to be relatively large correspondingly. Thus, the output MOSFET can be formed by utilizing the above pad space.

Further, in the wire bonding, after bonding a wire (metal wire) to the bonding pad, the wire is pulled out while being moved in the opposite direction to the lead and is then turned toward the lead. In such a nail head bonding, in order to hook the wire to a wire connected to the opposite bonding pad, it is necessary to separate between the pad rows by about 500 μm. In the embodiment, since the input/output buffers or the like are disposed in a space which is necessarily produced when two pad rows are formed, the high integration can be maintained.

Figure 5:
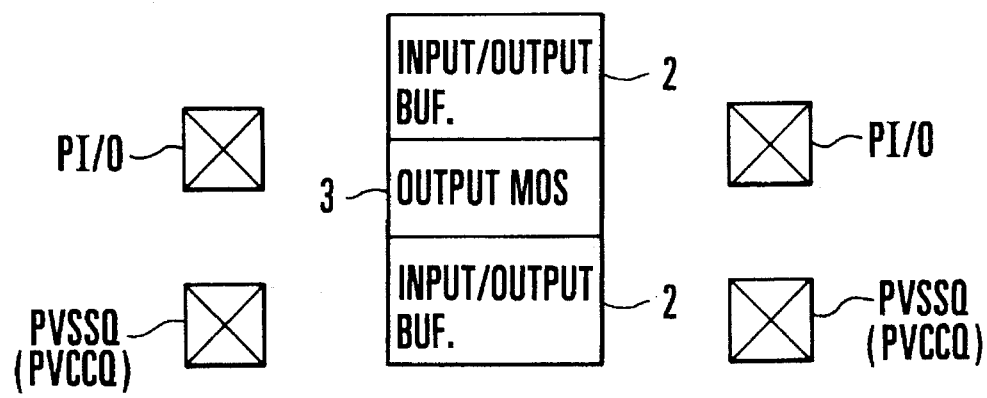
FIG. 5 is a diagram illustrating another arrangement of an output MOSFET in the peripheral circuit portion of FIG. 2.

FIG. 5 illustrates an example of another arrangement of the output MOSFET's. In this example, the output MOSFET's are formed in a space between the two pad rows. In this case, by sharing a source diffusion layer of a pair of output MOSFET's 3 constituting the output circuit, the higher integration can be attained. Particularly, when writing and reading of data are performed in a unit of 8 bits, it is necessary to form 16 output MOSFET's. By sharing the source diffusion layer of each pair of output MOSFET's thereof, an area for the output circuit can be reduced.

Figure 6A:
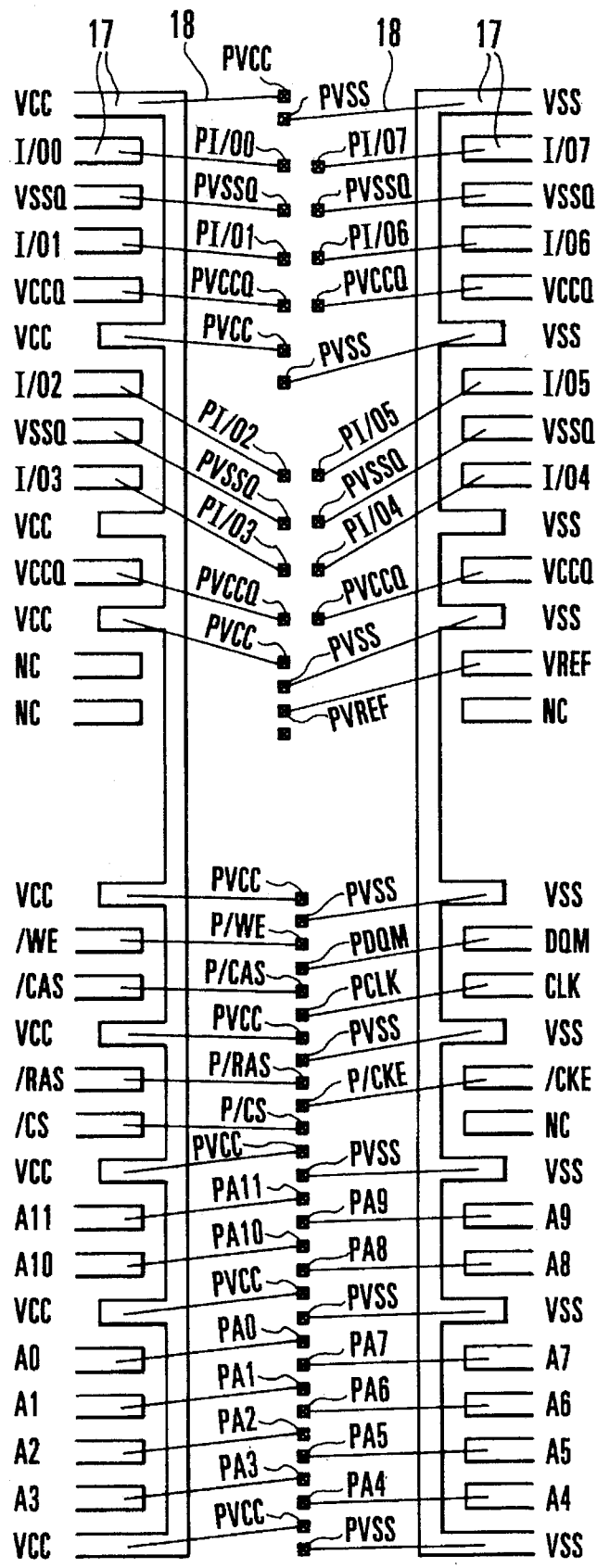
FIG. 6A is a plan view illustrating a relation of bonding pads, lead frames and wires in an embodiment of a semiconductor memory device according to the present invention.
Figure 6B:
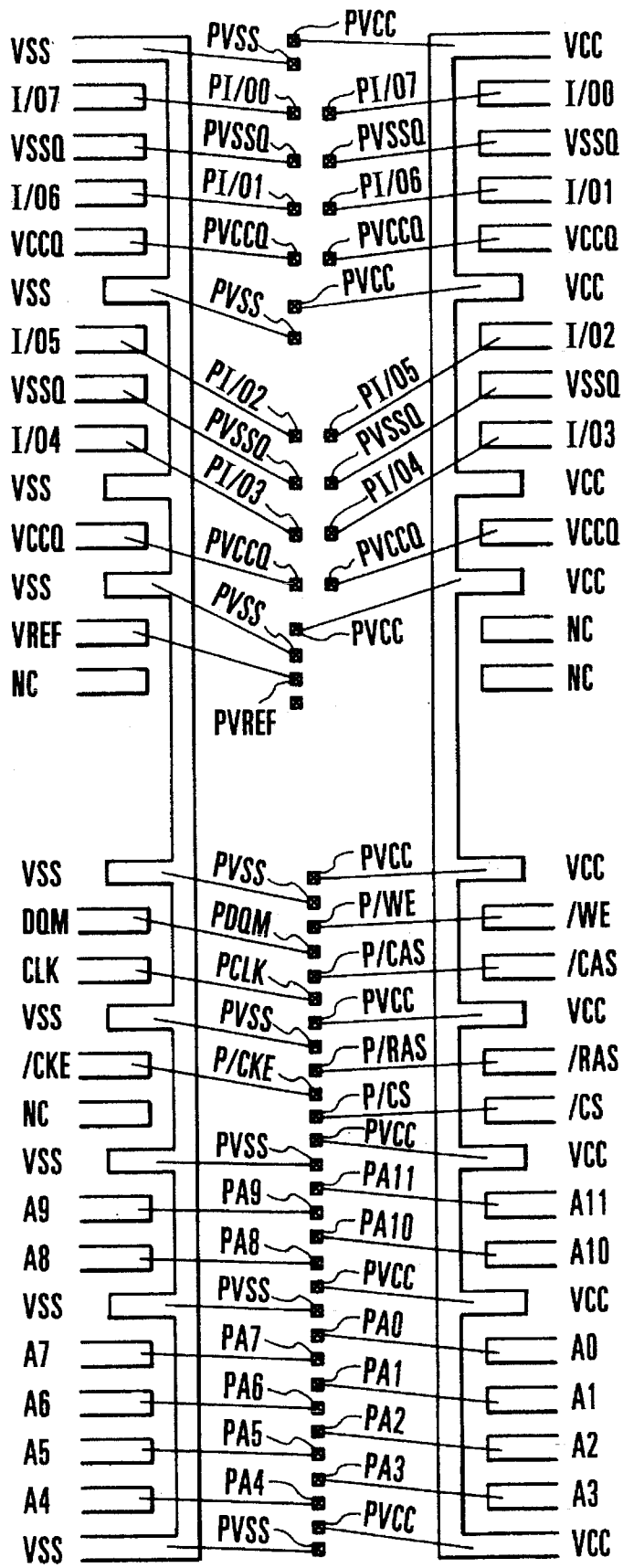
FIG. 6B is a plan view illustrating a relation of bonding pads, lead frames and wires in case of mounting on a reverse side when the semiconductor memory devices of FIG. 6A are mounted on both sides.

FIGS. 6A and 6B are schematic diagrams illustrating a relation of bonding pads, lead frames and wires in the semiconductor memory device according to the present invention and are diagrams for the obverse side mounting and the reverse side mounting when the semiconductor memory devices are mounted on both sides, respectively. In FIG. 6A, numeral 17 denotes inner lead portions of lead frames 15 and numeral 18 denotes bonding wires. Pads corresponding to the inner lead portions (terminals) to which various signals (I/O, CLK etc.) and power supply voltages (VCC etc.) are applied are designated by reference marks indicative of the terminals with P. DQM and /CKE represent a clock signal for input/output mask control and a clock signal for clock enable, respectively, A0 to A11 represent address data, and NC represents empty terminal.

Figure 7:
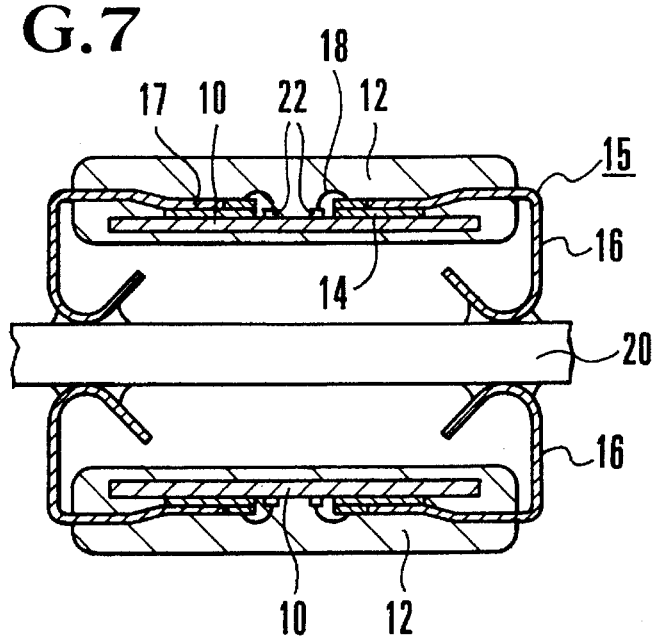
FIG. 7 is a sectional side view schematically illustrating a semiconductor memory device according to the present invention mounted on both sides.

FIG. 7 is a sectional side view illustrating semiconductor memory devices according to the present invention mounted on both sides of a substrate. In FIG. 7, numeral 10 denotes a semiconductor chip, 12 a resin molding, 16 an outer lead portion, and 20 a substrate. As apparent from FIG. 7, in the semiconductor device of the LOC structure, inner lead portions 17 of a plurality of leads 15 are disposed on the semiconductor chip 10 through at least one insulating film 14 and the inner lead portions are electrically insulated from the semiconductor chip. In addition, the semiconductor devices are mounted on one side and the other side of the substrate so that a principal surface of the semiconductor chip is opposed to the opposite surface thereof through the substrate.

In the embodiment, since pads for at least data input/output are arranged in two rows as described later, the outer lead portions of the RAM mounted on the reverse side are bent in the same direction as the outer lead portions of the RAM mounted on the obverse side when the RAM's are mounted on both sides, that is, the bending direction of the outer lead portions of the RAM mounted on the reverse side and the bending direction of the outer lead portions of the RAM mounted on the obverse side in the both-side mounting are both a principal surface of the semiconductor chip and a surface opposite to the principal surface of the semiconductor chip. Accordingly, there is no possibility that the leads are broken even if used for a long term, and the RAM mounted on the reverse side can be fabricated in the same wire bonding process as the RAM mounted on the obverse side without correction of a mask for the RAM mounted on the obverse side. In the embodiment, the data input/output pads PI/O0 to PI/O7 and the power supply pads PVSSQ and PVCCQ for the output circuit are disposed symmetrically with respect to the longitudinal central line of the chip. A pattern of leads connected to the pads through wires is also formed symmetrically with respect to the longitudinal central line correspondingly.

Figure 9A:
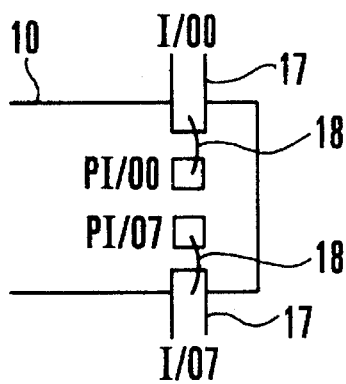
Figure 9B:
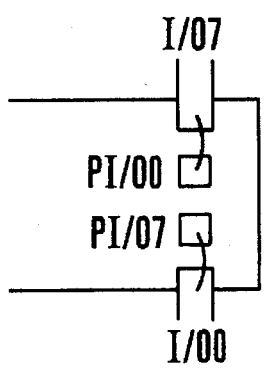

In this manner, by disposing the data input/output pads and the power supply pads for the output circuit symmetrically, when the reverse chip RAMs to be mounted on the reverse side are assembled, the bonding of this portion is performed without any modification. However, as shown in FIG. 9A, data I/O0 inputted from a lead (external terminal) for I/O0 is written in a memory cell corresponding to the lead in the RAM mounted on the obverse side as it is, whereas as shown in FIG. 9B since right and left leads in the RAM mounted on the reverse side are opposite to the case of mounting on the obverse side, the data I/O0 is written in the memory cell corresponding to the lead for the data I/O7 within the memory. However, since the written data is read from the same memory cell as the written memory cell, there is no problem in operation of the memory. On the other hand, other leads which are not disposed symmetrically, that is, leads (terminals) for power supplies VCC and VSS and reference voltage VREF are required to be connected so that the leads correspond to the bonding pads in one-to-one relation as described later and accordingly pads PVCC, PVSS and PVERF corresponding to the leads are arranged in a row as shown in FIGS. 6A and 6B.

More particularly, the bonding pads corresponding to leads (terminals) for control signals (/WE, /CAS, etc.) and address data (A0 to A11) are arranged side by side in a row in the longitudinal direction in the lower half of the chip as shown in FIGS. 6A and 6B. This reason is that externally supplied control signals are changed with the internally transmitted control signals in place in the horizontal direction if the bonding pads are arranged in two rows and are changed with each other in place in the horizontal direction. With regard to the address signals, externally inputted addresses are changed with internal addresses and there is almost no problem in the normal memory access. However, it is necessary to reconstruct a test pattern for a test mode exclusively and accordingly the pads for the addresses are arranged side by side in a row.

In the above structure, by changing positions of the bonding pads with respect to the leads by one position in the RAM mounted on the reverse side, the bonding is performed.

Figure 8A:
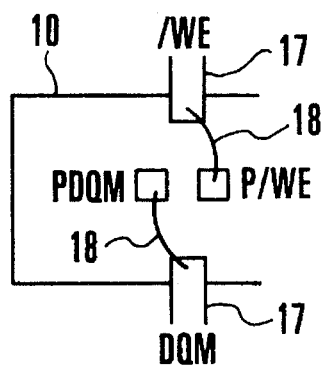
FIGS. 8A and 9A illustrate a relation of bonding pads and leads in mounting on an obverse side when the semiconductor memory devices of FIG. 6A are mounted on both sides.
Figure 8B:
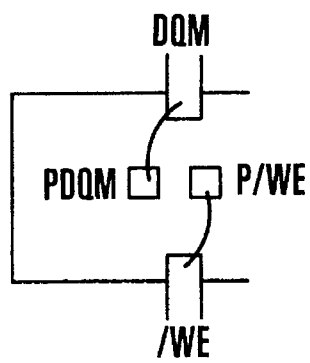
FIGS. 8B and 9B illustrate a relation of bonding pads and leads in mounting on a reverse side when the semiconductor memory devices of FIG. 6A are mounted on both sides.

For example, as compared with the RAM mounted on the obverse side shown in FIGS. 6A and 8A, in the RAM mounted on the reverse side shown in FIGS. 6B and 8B, leads for signals /WE and DQM are changed with each other and the lead for the signal DQM of FIGS. 6B and 8B becomes the lead for the signal /WE. Accordingly, the position of the bonding pads corresponding thereto are shifted down by one pad to perform the wire bonding. Similarly, the wire bonding is performed even for sets of other leads and bonding pads (pair of PVCC and PVSS, pair of P/CAS and PCLK, pair of P/RAS and P/CKE, pair of PA11 and PA9, etc.) in FIG. 6B.

In other words, according to the present invention, the bonding pads having the same functions are arranged in two rows, while the bonding pads having different functions are arranged in one row. Each of the wires extended from the bonding pads arranged in one row to the leads is opposite in direction between the RAM mounted on the obverse side and that mounted on the reverse side. In contrast, each of the wires extended from the bonding pads arranged in two rows to the leads is same in direction between the RAM mounted on the obverse side and that mounted on the reverse side. Accordingly, in this case, the wires extended from bonding pads arranged in two rows do not cross one another, thereby preventing contacting or short-circuiting of the wires.

In FIGS. 6A, 6B, 8A and 8B, a signal with "/" before alphabetic letters such as /WE represents that a low level is an active level. In this application, a signal having low level as active level is represented by mark following "/" or mark with B (meaning of bar) following the mark representing the signal.

Figure 10:
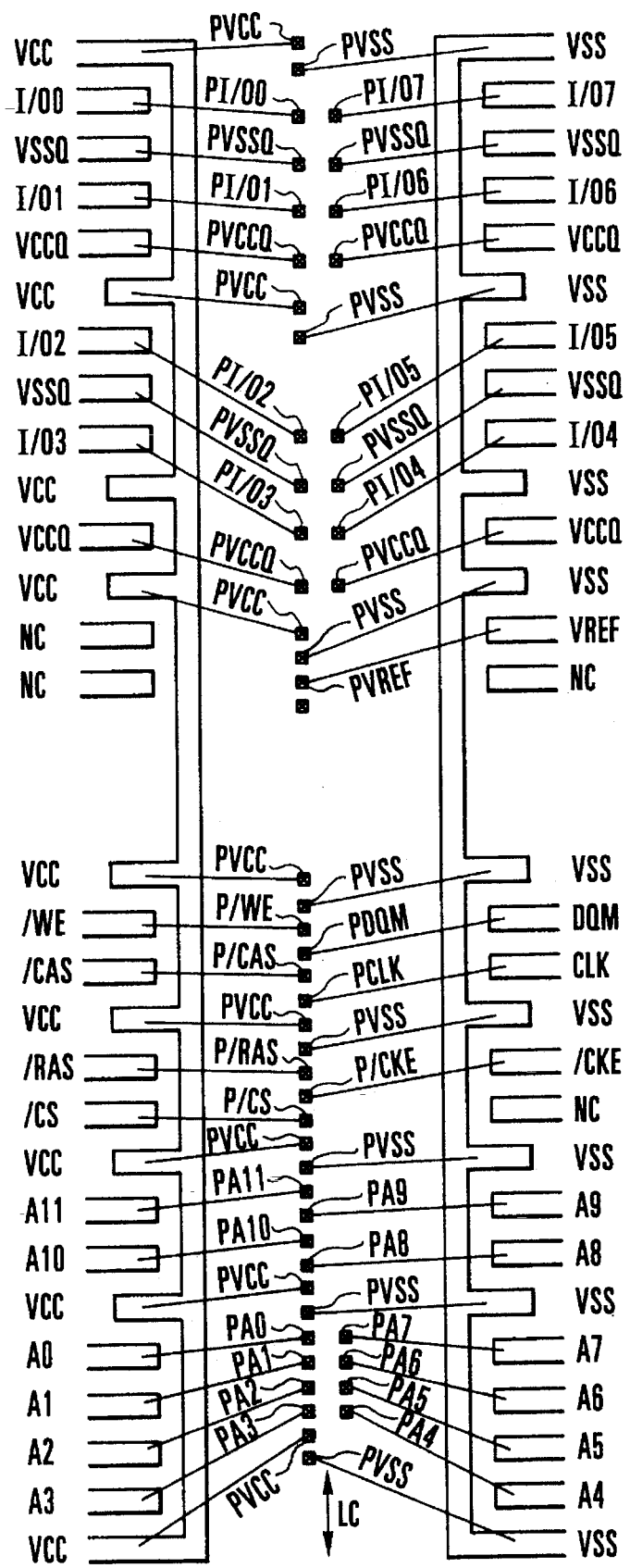
FIG. 10 is a plan view illustrating a relation of bonding pads, lead frames and wires in another embodiment of a semiconductor memory device according to the present invention.

In the present invention, as shown in FIG. 10, the bonding pads for address data may be arranged in two rows in the same manner as the bonding pads for data input/output and right and left leads with respect to the central line in the longitudinal direction in mounting on the obverse side may be changed with each other in the case of mounting on the reverse side to be connected to the bonding pads. FIG. 10 illustrates bonding pads (PA0 to PA7) corresponding to lower address data A0 to A7, for example, of the bonding pads for address data in the arrangement of FIG. 6a and arranged in two rows in substantially the same straight line as two rows of the upper half of the chip. That is, the number of external terminals is increased in a RAM having a large memory capacity and a RAM having a memory access being performed in a unit of multiple bits such as 16 bits or 32 bits. In this case, the RAM of the LOC structure has no space (length in the longitudinal direction of the chip) for arranging many bonding pads. Accordingly, by arranging the many bonding pads including address terminals in two rows, the many bonding pads can be arranged in the chip effectively.

In other words, in the embodiment of FIG. 10, the length in the longitudinal direction of the chip can be shortened by a length LC as compared with the embodiment of FIG. 6A.

In the RAM of the address multiplexing system, since the address signals for the X system and the address signals for the Y system are inputted sequentially through the same leads (terminals) for address data, there is no problem in operation even if the right and left leads (terminals) for address are changed with each other in the RAM mounted on the reverse side. However, when the memory access is to be performed by means of a test pattern in which influence of the checker pattern and adjacent bits is considered, the internal addresses are different in the RAM mounted on the reverse side from the RAM mounted on the obverse side as they are. Accordingly, when the RAM mounted on the reverse side is examined, a test pattern having modified addresses for the test pattern may be prepared in accordance with change of the right and left leads and bonding pads.

Figure 11:
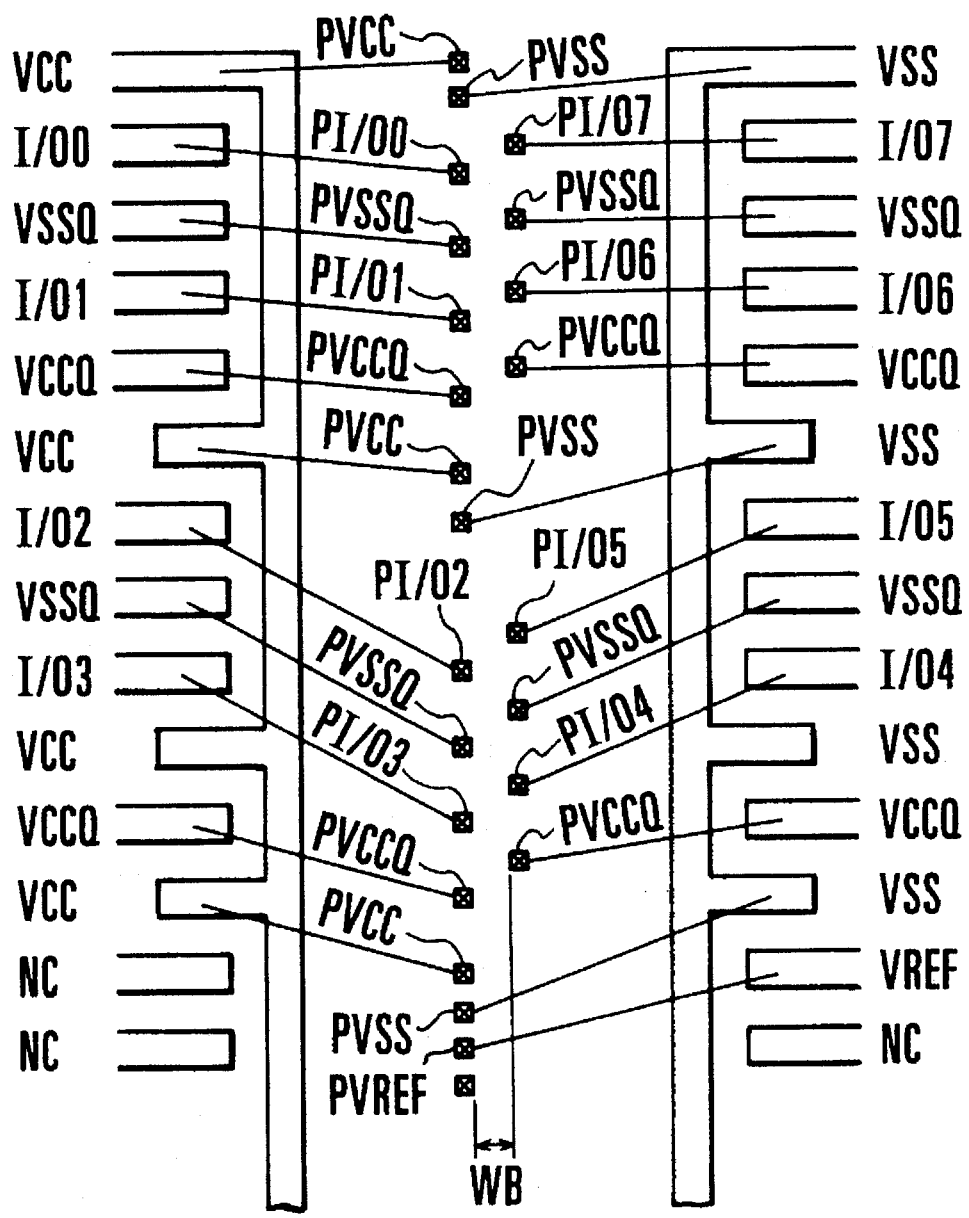
FIG. 11 is a plan view illustrating a relation of bonding pads, lead frames and wires in still another embodiment of a semiconductor memory device according to the present invention.

In the present invention, as shown in FIG. 11, the bonding pads arranged in two rows may be arranged to be shifted so that the bonding pads in adjacent rows are not opposite to each other. In this case, since the bonding pads in the adjacent rows are not opposite to each other, there is no possibility that wire comes into contact with wire connected to the bonding pad in the adjacent row in the nail head bonding. Accordingly, since a distance WB between the bonding pad rows can be shortened as compared with the embodiment of FIG. 6A, a chip area can be reduced.

The embodiment of FIG. 11 is applied to the arrangement of the bonding pads for data and power supplies for the output circuit, while the embodiment of FIG. 11 can be applied to the arrangement of the bonding pads for address data.

Figure 12:
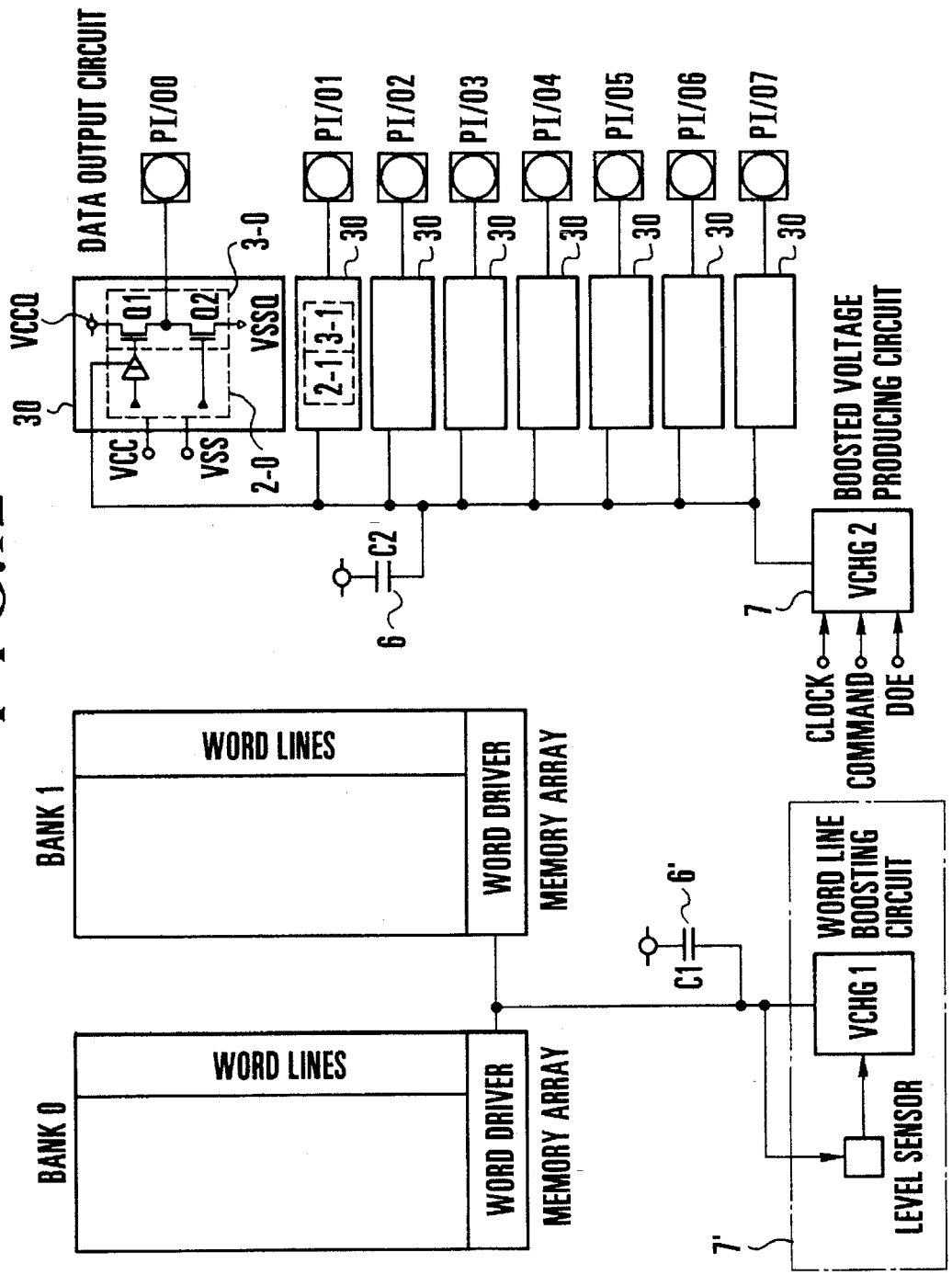

FIG. 12 is a schematic diagram illustrating a portion of an embodiment of a dynamic RAM (DRAM) to which the present invention is applied. In the embodiment, two boosted voltage producing circuits VCHG1 (7') and VCHG2 (7) are provided. One boosted voltage producing circuit VCHG1 is a word line boost circuit for producing a boosted voltage VCH supplied to word drivers of the memory array. The other boosted voltage producing circuit VCHG2 produces a boosted voltage VCH supplied to a data output circuits 30.

The boosted voltage producing circuit VCHG2 is composed of a charge pump circuit and supplies a boosted voltage to a smoothing condenser C2 (6). The smoothing condenser C2 has a relatively large capacitance such as several tens pF to several nF and requires a relatively large occupation area for forming it on the semiconductor substrate. However, the condenser can be formed effectively by utilizing a space between the bonding pads.

The data output circuits 30 are adapted to perform reading of data in a unit of 8 bits such as data I/O0 to I/O7. Accordingly, 8 data output circuits are mounted as a whole.

The data output circuit 30 is formed into a push-pull configuration, for example, and includes an output MOS circuit 3 having two N-channel MOSFET's Q1 and Q2 applied with the power supply voltages VCCQ and VSSQ and an input/output buffer 2. For example, the data output circuit 30 corresponding to the pad PI/O0 of FIG. 12 and connected thereto includes the output MOS circuit 3-0 and the input/output buffer 2-0 of FIG. 3 and the data output circuit 30 corresponding to the pad PI/O1 includes the output MOS circuit 3-1 and the input/output buffer 2-1 of FIG. 3. Further, the boosted voltage producing circuit VCHG2 corresponds to the VCH 7 of FIG. 3 and the condenser C2 corresponds to the condenser (Cap. 6). The boosted voltage producing circuit VCHG1 and the level sensor (7') are formed in the same area corresponding to the VCH 7 of FIG. 3 and the condenser C1 (6') is formed in the same area corresponding to the condenser (Cap. 6). Further, the condenser C1 may be formed in the same area as that of the condenser (Cap. 6).

In outputting of data, both output MOSFET's Q1 and Q2 are controlled complementarily to send high and low level output signals to the pads for the input/output data I/O. The data output circuits 30 are set to the high impedance state by turning off both of the output MOSFET's Q1 and Q2 when the dynamic RAM is in the standby state or the write state.

When the output MOSFET Q1 on the side of the power supply voltage VCC is turned on to produce a high level signal such as the power supply voltage VCC, the output level is reduced by an effective threshold voltage of the output MOSFET Q1 in case where a drive voltage supplied to a gate of the output MOSFET Q1 is a high level such as the power supply voltage VCC. Particularly, when the power supply voltage VCC is a relatively low voltage such as 3.3 V, a necessary signal amplitude is not obtained.

In the embodiment, the operating voltage of a CMOS inverter circuit composed of a P channel MOSFET and an N channel MOSFET constituting a drive circuit for driving the output MOSFET Q1 on the side of the high level is assumed to be the above boosted voltage VCH. By applying the boosted voltage VCH to the drive circuit, a high level of the drive voltage supplied to the gate of the output MOSFET Q1 can be set to a higher voltage than the power supply voltage VCC such as the boosted voltage VCH. The boosted voltage VCH is set to be an effective threshold voltage Vth or more of the output MOSFET Q1 higher than the power supply voltage VCC. Thus, in the reading operation, when the drive voltage is a high level voltage such as VCH, the output voltage corresponding to the power supply voltage VCC can be sent from a source side of the output MOSFET Q1 without level loss as described above.

As described above, 8 drive circuits corresponding to 8 output circuits are provided. In order to maintain the operating voltage of the 8 drive circuits stably, the smoothing condenser C2 requires a relatively large capacitance as described above. Accordingly, the smoothing condenser occupies a large occupation area, while the space for forming the smoothing condenser can be ensured since the wiring length can be shortened in the bonding pads arranged in two rows.

The boosted voltage producing circuit VCHG2 is supplied with a clock CLK, a command and an output enable signal DOE and when a read mode is indicated by the command and when the output enable signal DOE is supplied, the boost operation is controlled by the clock pulse. Accordingly, the dynamic RAM of the embodiment is a so-called synchronous dynamic RAM.

The boosted voltage producing circuit VCHG1 for boosting the word line includes a level sensor and performs boosting operation by pulses formed by an oscillation circuit included therein when the boosted voltage is reduced. The boosting operation is made by a word line selection timing signal. Thus, reduction of the word line due to a current flowing in the selection operation of the word line is prevented by performing the boosting operation prior to the selection operation of the word line.

Since the word line boosted voltage is the same as the boosted voltage for the output, the smoothing condenser C1 for the word line boosting may be omitted and the smoothing condenser C2 for output may be used for the word line boosting. That is, the smoothing condenser C1 may be omitted and the outputs of both the boosted voltage circuits VCH1 and VCH2 may be connected in common.

FIG. 13 schematically illustrates a portion of a memory board constituting a memory unit in a computer system to which the DRAM's of the present invention are applied. The memory board is composed of a plurality of memory modules. A plurality of package-sealed DRAM's of the present invention are mounted on the memory module and the DRAM's of the present invention are connected to wiring on the memory module. In this case, the DRAM's are mounted on the reverse side of the memory module. Thus, the number of the DRAM's mounted on one memory module is increased.

The DRAM's of the present invention are connected to an address bus or a data bus in the computer system through connectors on the memory module. This connection is made by inserting the connectors into slots for memory boards in the memory unit of the computer system. The information storage capacity of the memory unit of the computer system is determined by the number of DRAM's of the present invention mounted on the memory board or the memory module.

FIG. 14 is a schematic diagram illustrating a DRAM control system using the DRAM of the present invention. The system includes a DRAM IC array, a central processing unit CPU, and an interface circuit IF for interfacing the DRAM's and the central processing unit CPU. The DRAM IC array includes the assembled DRAM's of the present invention.

Input/output signals between the DRAM system and the central processing unit CPU are described. Address signals A0 to Ak produced by the central processing unit CPU select an address of the DRAM of the present invention. A refresh indication signal REFGRNT is a control signal for refreshing memory information of the DRAM of the present invention. A write enable signal WEB is a reading and writing control signal of data in the DRAM of the present invention. A memory start signal MS is a control signal for starting memory operation of the DRAM of the present invention. Input/output data D1 to DB in a data bus are transmitted between the central processing unit CPU and the DRAM. A refresh request signal REFREQ is a control signal for requesting to refresh memory information of the DRAM of the present invention.

In the interface circuit IF, a row address receiver RAR receives address signals A0 to Ai of the address signals A0 to Ak sent from the central processing unit CPU and converts them to address signals having a timing matched to operation of the DRAM of the present invention. A column address receiver CAR receives address signals Ai+1 to Aj of the address signals A0 to Ak and converts them to address signals having a timing matched to operation of the DRAM of the present invention. The address receiver ADR receives address signals Aj+1 to Ak of the address signals A0 to Ak and converts them to address signals having a timing matched to operation of the DRAM of the present invention.

A decoder DCR sends chip selection control signals (hereinafter referred to as CS1 to CSm) for selecting a chip of the DRAM of the present invention. An RAS control circuit RAS-CONT sends chip selection signals and a row address taking-in signal having a timing matched to operation of the DRAM of the present invention. An address multiplexer ADMPX multiplexes the address signals A0 to Ai and Ai+1 to Aj in time sequential manner and sends the signals to the DRAM of the present invention. A data bus driver DBD switches input/output of data between the central processing unit CPU and the DRAM of the present invention in accordance with the WEB signal. A control circuit CONT sends signals for controlling the address multiplexer ADMPX, the RAS control circuit RAS-CONT, the data bus driver DBD, the DRAM of the present invention and the like.

Function of the address signals in the DRAM system is described. The address signals A0 to Ak sent from the central processing unit CPU are divided into two functions of the address signals A0 to Aj and the address signals Aj+1 to Ak in the DRAM system. That is, the address signals A0 to Aj are used as address signals for a row system and a column system of a memory matrix in chips of the DRAM of the present invention. The address signals A0 to Aj are designed to be assigned to row selection of the IC chip array of the DRAM of the present invention and the address signals Ai+1 to Aj are designed to be assigned to column selection of the IC chip array.

Operation of the circuit in the DRAM system is described. The address signals A0 to Ai and Ai+1 to Aj are supplied through the row address receiver RAR and the column address receiver CAR to the address multiplexer ADMPX. In the address multiplexer ADMPX, when an RASbB signal reaches a certain level, the address multiplexer sends out the row address signals A0 to Ai and supplies the signals to address terminals of the DRAM of the present invention. At this time, the column address signals Ai+1 to Aj are not sent out from the address multiplexer ADMPX.

When the RASbB signal becomes a level opposite to the above level, the column address signals Ai+1 to Aj are sent out from the address multiplexer ADMPX and are supplied to the address terminals. At this time, the row addresses A0 to Ai are not sent out from the address multiplexer ADMPX.

In this manner, the address signals A0 to Ai and Ai+1 to Aj are supplied to the address terminals of the DRAM of the present invention in time sequential manner in accordance with the level of the RASbB signal. The chip selection signals Aj+1 to Ak mainly select the chip in the DRAM of the present invention by means of the decoder DCR. The signals are converted to chip selection signals CS1 to CSm and are used as chip selecting signals and row address taking-in signals.

Setting operation of addresses in the chip in each row of the DRAM of the present invention is described. The row address signals A0 to Ai are supplied to the address terminals of all of the IC chips of the DRAM of the present invention. Then, when one of RAS1B to RASmB signals, for example, RAS1B signal reaches a certain level, it is assumed that B IC's of the uppermost position are selected. At this time, the row address signals A0 to Ai are supplied to row addresses of memory matrixes in the IC chips (IC11, IC12, ..., IC1B) before application of the RAS1B signal. This reason is that if the RAS1B signal is supplied before application of the row address signals A0 to Ai, there is a possibility that signals other than the row address signals are taken in.

Then, the column address signals Ai+1 to Aj are supplied to the address terminals of all of IC chips of the DRAM of the present invention. Thereafter, when the CASB signal delayed from the RAS1B signal reaches a certain level, the column address signals Ai+1 to Aj are taken in the column addresses of the memory matrix array in nM and B IC chips of the uppermost position. In this connection, the reason that the column address signals Ai+1 to Aj are supplied to the IC's before application of the CASB signal is the same as the above-described reason. Function of the CASB signal is to identify either the row address signals A0 to Ai or the column address signals Ai+1 to Aj being sent.

With the above operation, the addresses in nM and B chips of the uppermost position of the DRAM of the present invention are set. IC's except the uppermost position of the DRAM of the present invention are not selected since the RAS2B to RASmB signals have a level opposite to the level of the RAS1B signal.

Writing operation and reading operation of data in the set addresses as described above are now described. The writing operation and the reading operation of data are designed to be determined by a high level or a low level of the WEB signal. The writing operation is performed by applying data DI1 to DIB from the central processing unit CPU to the set addresses when the WEB signal is a certain level.

The reading operation is made by producing data Do1 to DoB in B bits of the respective addresses to which writing is completed when the WEB signal has a level opposite to the above level. The control circuit CONT receives instruction signals, that is, the REFGRNT signal, the WEB signal and the MS signal from the central processing unit CPU and sends the CASB signal, the RASaB signal, the RASbB signal and the WEB signal. Function of the sent control signals is described. The CASB signal is a signal for identifying whether any of the row address signals A0 to Ai or the column address signals Ai+1 to Aj are sent to each of the chips in the DRAM of the present invention and for taking in the column address signal of the IC chip.

The RASaB signal is a signal for supplying the CS1 to CSm signals to the IC chip array in the DRAM of the present invention synchronously. The WEB signal is a signal for determining reading of data from the memory cell and writing of data to the memory cell in the IC chip in the DRAM of the present invention. The RASbB signal is a change-over timing signal for converting the row address signals A0 to Ai and the column address signal Ai+1 to Aj from the address multiplexer ADMPX to time sequential multiplex signals. When one of the RASB (RASB1 to RASBm) signals is selected, a change-over timing of the row address signals A0 to Ai and the column address signals Ai+1 to Aj is delayed from the RASaB signal so that the row address signals A0 to Ai are produced from the address multiplexer ADMPX.

A relation of the WEB signal and the data bus driver DBD is described. The WEB signal sent from the control circuit CONT is applied to the DRAM of the present invention and the data bus driver DBD. For example, when the WEB signal is high level, the reading mode is set and data of the DRAM of the present invention are produced and sent to the central processing unit CPU through the data bus driver DBD. At this time, the input data are controlled not to be taken in the DRAM of the present invention from the data bus driver DBD by the WEB signal. Further, when the WEB signal is low level, the writing mode is set and input data is applied from the central processing unit CPU through the data bus driver DBE to the data input terminals of the DRAM of the present invention to be written in the set address. At this time, the data outputs of the DRAM of the present invention are controlled not to be produced from the data bus driver DBD by the WEB signal.

When the RAM is a synchronous DRAM as described above, the clock signal and the control signal necessary for the operation thereof are added. Further, commands are supplied from the central processing unit CPU through the data bus to the DRAM.

Effects obtained by the embodiment are as follows.

(1) At least data input/output pads are arranged in the central portion of the semiconductor chip in two rows in parallel axially symmetrically and the pad rows are connected to leads of the LOC structure insulatively mounted on the chip by wire bonding to thereby shorten the pad row and reduce the size of the chip correspondingly.

(2) The RAM mounted on the reverse side can be obtained by the same wire bonding process as that of the RAM mounted on the obverse side.

(3) The input/output buffers can be disposed between the pads arranged in two rows to thereby effectively utilize a space formed by the two-row arrangement of the pads.

(4) The smoothing condenser for holding the boosted voltage for driving the output MOSFET can be disposed adjacent to the pads arranged in two rows to thereby effectively utilize a space formed by the two-row arrangement of the pads.

The present invention has been described in detail on the basis of the embodiment, while the present invention is not limited to the embodiment. It is needless to say that various modifications can be made without departing from the gist of the present invention. For example, the RAM may be a conventional dynamic RAM in addition to the synchronous RAM. In this case, a memory array and a peripheral circuit thereof can adopt various configurations. Further, in addition to the dynamic RAM, a static RAM of the LOC structure can be applied similarly.

The present invention can be applied to various ROM's in addition to the dynamic RAM and the static RAM of the LOC structure in which the memory access is made in a unit of a plurality of bits.

Effects obtained by representative inventions of the present invention disclosed in the application are as follows. At least data input/output pads are arranged in the central portion of the semiconductor chip in two rows in parallel axially symmetrically and the pad rows are connected to leads of the LOC structure insulatively mounted on the chip by wire bonding to thereby shorten the pad row and reduce the size of the chip correspondingly. The RAM mounted on the reverse side can be obtained by the same wire bonding process as that of the RAM mounted on the obverse side.

What is claimed is:

1. A semiconductor memory device, comprising:
   a semiconductor chip having a main surface and memory array blocks formed on said main surface, and a plurality of bonding pads formed on said main surface at a substantially center portion of said main surface, said plurality of bonding pads including a first group of bonding pads extending in a first part of the substantially center portion, and a second group of bonding pads extending in a second part of the substantially center portion;

a resin molding for sealing said semiconductor chip; and a plurality of leads, one end of each of said plurality of leads being positioned above said main surface of said semiconductor chip and electrically connected to a corresponding one of said plurality of bonding pads, and the other end of each of said plurality of leads being positioned outside of said resin molding, wherein said bonding pads of said first group are arranged in two rows, and said bonding pads of said second group are arranged in one row, and wherein said bonding pads of said first group include bonding pads for data input/output.

2. A semiconductor memory device according to claim 1, wherein a space between one row and the other row of said arranged-in-two-row bonding pads has a distance sufficient to connect said bonding wires by means of nail head bonding.

3. A semiconductor memory device according to claim 1, further comprising at least one input/output buffer disposed between one row and the other row of said arranged-in-two-row bonding pads.

4. A semiconductor memory device according to claim 1, further comprising a smoothing condenser disposed between one row and the other row of said arranged-in-two-row bonding pads for holding a boosted voltage for driving output MOSFET's.

5. A semiconductor memory device according to claim 1, further comprising:

output MOSFET's disposed between said bonding pads in one row of said arranged-in-two-row bonding pads and connected to said bonding pads for data input/output;

an input/output buffer disposed between one row and the other row of said arranged-in-two-row bonding pads for driving said output MOSFET's;

a boosted voltage producing circuit disposed between one row and the other row of said arranged-in-two-row bonding pads for producing a boosted voltage for driving said output MOSFET's; and a smoothing condenser disposed between one row and the other row of said arranged-in-two-row bonding pads for holding said boosted voltage.

6. A semiconductor memory device according to claim 1, wherein the memory array blocks include a pair of first array blocks and a pair of second array blocks, and wherein the first group of bonding pads is arranged between the pair of first array blocks and the second group of bonding pads is arranged between the pair of second array blocks.

7. A semiconductor memory device according to claim 6, wherein a respective one of the pair of first array blocks is positioned at one side of the first part of the substantially center portion, and a respective one of the pair of second array blocks is positioned at one side of the second part of the substantially center portion.

8. A semiconductor memory device according to claim 6, wherein the pair of first array blocks and the pair of second array blocks are positioned to provide a longitudinal central portion and a traverse central portion where the first and second array blocks are not located, said substantially center portion where the bonding pads are located being provided in the longitudinal central portion.

9. A semiconductor memory device according to claim 8, wherein peripheral circuits are provided in the longitudinal and traverse central portions.

10. A semiconductor memory device according to claim 1, wherein the leads are electrically insulated from said semiconductor chip.

11. A semiconductor memory device according to claim 1, further comprising an insulating film between the leads and the semiconductor chip, for electrically insulating the leads from the semiconductor chip.

12. A semiconductor memory device according to claim 1, wherein the first group of bonding pads, arranged in two rows, are positioned such that bonding pads in adjacent rows are not positioned opposite to each other.

13. A semiconductor memory system comprising:

a substrate; and two semiconductor memory devices mounted respectively on one side and an opposed side of said substrate, so that a principal surface of one of said two memory devices is opposed to an opposite surface of the other of said two memory devices through the substrate, each of the two memory devices comprising:

a semiconductor chip having a main surface and memory array blocks formed on said main surface, and a plurality of bonding pads formed on said main surface at a substantially center portion of said main surface, said plurality of bonding pads including a first group of bonding pads extending in a first part of the substantially center portion, and a second group of bonding pads extending in a second part of the substantially center portion;

a resin molding for sealing said semiconductor chip; and a plurality of leads, one end of each of said plurality of leads being positioned above said main surface of said semiconductor chip and electrically connected to a corresponding one of said plurality of bonding pads, and the other end of each of said plurality of leads being positioned outside of said resin molding, wherein said bonding pads of said first group are arranged in two rows, and said bonding pads of said second group are arranged in one row, and wherein said bonding pads of said first group include bonding pads for data input/output.

14. A semiconductor memory device system, comprising:

a semiconductor array including a plurality of semiconductor memory devices;

a central processing unit for controlling writing/reading of data of said semiconductor array; and an interface circuit for interfacing said central processing unit and said semiconductor array, wherein each of said plurality of semiconductor memory devices comprises:

a semiconductor chip having a main surface and memory array blocks formed on said main surface, and a plurality of bonding pads formed on said main surface at a substantially center portion of said main surface, said plurality of bonding pads including a first group of bonding pads extending in a first part of the substantially center portion, and a second group of bonding pads extending in a second part of the substantially center portion;

a resin molding for sealing said semiconductor chip; and a plurality of leads, one end of each of said plurality of leads being positioned above said main surface of said semiconductor chip and electrically connected to a corresponding one of said plurality of bonding pads, and the other end of each of said plurality of leads being positioned outside of said resin molding, wherein said bonding pads of said first group are arranged in two rows, and said bonding pads of said second group are arranged in one row, and wherein said bonding pads of said first group include bonding pads for data input/output.

15. A semiconductor memory device according to claim 1, including further bonding pads for address data, said further bonding pads being in two rows, the two rows of the further bonding pads for the address data respectively being in line with the two rows of the bonding pads of said first group.

16. A semiconductor memory device according to claim 15, wherein the memory array blocks include a pair of first array blocks and a pair of second array blocks, and wherein the first group of bonding pads is arranged between the pair of first array blocks and the second group of bonding pads is arranged between the pair of second array blocks.

17. A semiconductor memory device according to claim 16, wherein the further bonding pads for the address data are arranged between the pair of second array blocks.

* * * * *